United States Patent
Kido et al.

(10) Patent No.: US 6,632,545 B1
(45) Date of Patent: *Oct. 14, 2003

(54) ELECTROLUMINESCENT ELEMENT

(75) Inventors: Junji Kido, 4-3, Umamikita 9-chome, Kitakatsuragi-gun, Koryo-cho, Nara, 635-0831 (JP); Hiroyoshi Fukuro, Funabashi (JP); Hitoshi Furusho, Funabashi (JP); Tomoyuki Enomoto, Funabashi (JP)

(73) Assignees: Junji Kido, Koryo-cho (JP); Nissan Chemical Industries, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/914,207
(22) PCT Filed: Feb. 22, 2000
(86) PCT No.: PCT/JP00/01000
§ 371 (c)(1), (2), (4) Date: Aug. 23, 2001
(87) PCT Pub. No.: WO00/51404
PCT Pub. Date: Aug. 31, 2000

(30) Foreign Application Priority Data

Feb. 23, 1999 (JP) ............................................. 11/044077

(51) Int. Cl.⁷ .......................... B32B 19/00; B32B 9/00; H01J 1/62; H01J 63/04; C09K 11/06
(52) U.S. Cl. ........................ 428/690; 428/917; 313/503; 313/506; 252/301.16
(58) Field of Search .......................... 428/690, 917; 313/503, 506; 252/301.16, 500, 519.33; 257/40

(56) References Cited

U.S. PATENT DOCUMENTS 3,172,862 A  3/1965  Gurnee et al. ......... 252/301.16

(List continued on next page.)

FOREIGN PATENT DOCUMENTS

| EP | B1443861 | 8/1991 |
| JP | A3-216998 | 9/1991 |
| JP | A4145192 | 5/1992 |
| JP | A5-13171 | 1/1993 |
| JP | A6-17046 | 1/1994 |
| JP | A945479 | 2/1997 |
| JP | 2000-204158 | * 7/2000 |

OTHER PUBLICATIONS

Pope et al., *J. Chem. Phys.*, 38, *Letters to the Editor*, Physics Department, New York University, New York, *Electroluminescence in Organic Crystals*, pp. 2042–2043 (1963).

(List continued on next page.)

*Primary Examiner*—Marie Yamnitzky
*Assistant Examiner*—C Thompson
(74) *Attorney, Agent, or Firm*—Birch, Stewart, Kolasch & Birch, LLP

(57) ABSTRACT

In an electroluminescent device comprising an anode, a cathode, and an electroluminescent organic layer interposed therebetween, wherein a luminescent material in the organic layer emits light upon application of a voltage between the anode and the cathode, an auxiliary carrier transporting layer which contains an aromatic amine derivative comprising recurring units of formula (1) and having a number average molecular weight of 200–100,000 is formed between the anode and the organic layer.

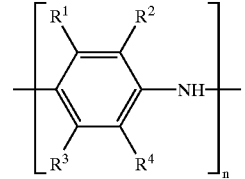

(1)

$R^1$ to $R^4$ each are hydrogen, hydroxyl, substituted or unsubstituted monovalent hydrocarbon, organooxy, acyl or sulfonate group, excluding the case where all $R^1$ to $R^4$ are hydrogen atoms at the same time, and n is a positive number of 2–3,000.

3 Claims, 3 Drawing Sheets

U.S. PATENT DOCUMENTS

| | | | | |
|---|---|---|---|---|
| 3,710,167 | A | | 1/1973 | Dresner et al. ............. 313/504 |
| 4,356,429 | A | | 10/1982 | Tang ........................... 313/503 |
| 5,317,169 | A | * | 5/1994 | Nakano et al. ................ 257/40 |
| 5,719,467 | A | * | 2/1998 | Antoniadis et al. ......... 313/506 |
| 5,748,271 | A | * | 5/1998 | Hikmet et al. ................. 349/69 |
| 5,795,942 | A | * | 8/1998 | Rhee et al. .................. 525/540 |
| 5,932,144 | A | * | 8/1999 | Shimizu et al. ............. 252/500 |
| 6,403,236 | B1 | * | 6/2002 | Ohnishi et al. ............. 428/690 |

OTHER PUBLICATIONS

Helfrich et al., *Physical Review Letters*, vol. 14, No. 7, pp. 229–231 (Feb. 15, 1965).

Helfrich et al., *The Journal of Chemical Physics*, vol. 44, No. 8, pp. 2902–2908 (Apr. 15, 1966).

Schadt et al., *The Journal of Chemical Physics*, vol. 50, No. 10, pp. 4364–4368 (May 15, 1969).

Partridge, *Polymer*, vol. 24, pp. 748–754 (Jun. 1983).

Hayashi et al., *Japanese Journal of Applied Physics*, vol. 25, No. 9, pp. L773–L775 (Sep. 1986).

Tang et al., *Appl. Phys. Lett.*, vol. 51, No. 12, pp. 913–915 (Sep. 21, 1987).

Adachi et al., *Japanese Journal of Applied Physics*, vol. 27, No. 2, pp. L269–L271 (Feb. 1988).

Adachi et al., *Japanese Journal of Applied Physics*, vol. 27, No. 4, pp. L713–L715 (Apr. 1988).

* cited by examiner

ELECTROLUMINESCENT ELEMENT

This application is the national phase under 35 U.S.C. §371 of PCT International Application No. PCT/JP00/01000 which has an International filing date of Feb. 22, 2000 which designated the United States of America, the entire contents of which are hereby incorporated by reference.

TECHNICAL FIELD

This invention relates to an electroluminescent device comprising at least one electroluminescent organic layer including a light emitting material layer interposed between an anode and a cathode, wherein the light emitting material layer emits light upon application of a voltage between the anode and the cathode.

BACKGROUND ART

The electroluminescent phenomenon of organic material was observed on anthracene single crystals (J. Chem. Phys., 38 (1963), 2042). Thereafter, a relatively intense luminescent phenomenon was observed using a solution electrode having high injection efficiency (Phys. Rev. Lett., 14 (1965) 229). Thereafter, active research works were made on organic luminescent materials between conjugated organic host materials and conjugated organic activators having a fused benzene ring (U.S. Pat. No. 3,172,862, U.S. Pat. No. 8,710,167, J. Chem. Phys., 44 (1966), 2902, Application No.: 09/914,207 and J. Chem. Phys., 50 (1969), 4364). The organic luminescent materials listed herein, however, suffer from the drawbacks of increased film thickness and a high electric field needed to induce luminescence.

As one countermeasure, researches were made on thin-film devices using evaporation technique and succeeded in lowering drive voltage. Such devices, however, failed to provide luminance at a practically acceptable level (Polymer, 24 (1983), 748, and Jpn. J. Appl. Phys., 25 (1986), L773).

Recently, Eastman Kodak proposed a device in which a charge transporting layer and a light emitting layer are formed between electrodes by an evaporation technique, accomplishing a high luminance at a low drive voltage (Appl. Phys. Lett., 51 (1987), 913 and U.S. Pat. No. 4,356,429). Thereafter, research works were further activated, as by shifting to three layer type devices in which carrier transporting and light emitting functions are separated. From then onward, the study on organic electroluminescent devices entered the practical stage (Jpn. J. Appl. Phys., 27 (1988), L269, L713).

However, there remains a serious problem of product lifetime as demonstrated by a luminescent life which is 3,000 hours at the shortest and several ten thousands of hours at the longest when operated at several hundreds of candelas.

It was also found that the above-described devices are prone to delamination due to moisture adsorption and thermal degradation and substantially increase dark spots during long-term service. It is believed that such degradation is mainly caused by interfacial separation between the inorganic electrode and the organic layer and the potential barrier between the electrodes and the respective carrier transporting materials although these problems remain outstanding.

DISCLOSURE OF THE INVENTION

An object of the invention is to provide an organic electroluminescent device in which the drive voltage is lowered in order to prevent degradation thereof.

Making extensive investigations to attain the above object, the inventors have found that in an electroluminescent device comprising at least one electroluminescent organic layer interposed between the anode and the cathode, especially an electroluminescent device in which an organic hole transporting layer and a light emitting material layer are sequentially deposited on an inorganic electrode (ITO electrode etc.) serving as the anode and the cathode is disposed thereon, improved adhesion and an effective lowering of device drive voltage are achieved by providing an auxiliary carrier transporting layer between the anode and the organic layer (especially between the inorganic electrode and the organic hole transporting layer), and forming the auxiliary carrier transporting layer mainly from the aromatic amine derivative of the general formula (1), and especially, the soluble, electrically conductive compound or polymer that the aromatic amine derivative forms with a dopant.

Specifically, the invention provides an electroluminescent device comprising an anode, a cathode, and at least one electroluminescent organic layer interposed therebetween, wherein a luminescent material in the organic layer emits light upon application of a voltage between the anode and the cathode, characterized in that an auxiliary carrier transporting layer which contains an aromatic amine derivative comprising recurring units of the following general formula (1) and having a number average molecular weight of 200 to 100,000, and especially a soluble conductive compound in which the aromatic amine derivative forms a salt with an electron accepting dopant, is formed between the anode and the organic layer.

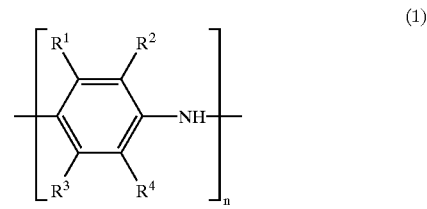

(1)

Herein $R^1$ to $R^4$ each are independently hydrogen, a hydroxyl group, substituted or unsubstituted monovalent hydrocarbon group, organooxy group, acyl group or sulfonate group, excluding the case where all $R^1$ to $R^4$ are hydrogen atoms at the same time, and n is a positive number of 2 to 3,000.

BEST MODE FOR CARRYING OUT THE INVENTION

Figure 1:
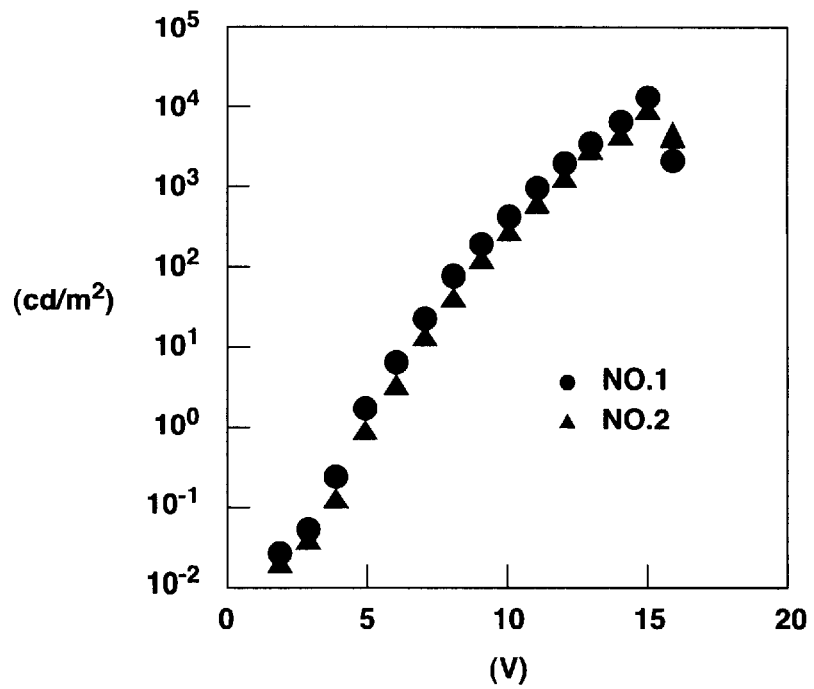
FIG. 1 is a graphic showing the dependence of emission luminance on voltage of the electroluminescent device fabricated in Example 1 and 2.

The electroluminescent device of the invention includes an anode, a cathode and an electroluminescent organic layer therebetween.

The anode and cathode used herein may be well-known electrodes. For example, the anode may be an inorganic electrode (or transparent electrode) of ITO or the like formed on a glass substrate. The cathode may be a metallic electrode of aluminum, MgAg alloy or the like.

The electroluminescent organic layer includes a light emitting material layer and may be of well-known construction. A laminate construction in which a hole transporting layer, a light emitting material layer, and a carrier transporting layer are sequentially stacked from the cathode side is typical, though the invention is not limited thereto.

The hole transporting material is not critical although it is generally selected from tertiary aromatic amines such as N,N,N-tris(p-toluyl)amine (TPD), 1,1-bis[(di-4-toluylamine)phenyl]cyclohexane, N,N'-diphenyl-N,N'-bis (3-methylphenyl)(1,1'-biphenyl)-4,4'-diamine, N,N,N',N'-tetrakis(4-methylphenyl)(1,1'-biphenyl)-4,4'-diamine, N,N'-bis(1-naphthyl)-N,N'-diphenyl-1,1'-bisphenyl-4,4'-diamine, and 4,4',4"-tris(3-methylphenylamino)triphenylamine. Pyrazoline derivatives are also useful.

The carrier transporting material is not critical although generally aromatic fused ring compounds and metal complex compounds are often used. Examples include metal complex compounds such as tris(8-hydroxyquinoline) aluminum (Alq3) and bis(10-hydroxybenzo[h]quinolate) beryllium (BeBq2), 1,3,4-oxathiazole derivatives, 1,2,4-triazole derivatives, bis(benzimidazole) derivatives of perylene dicarboxyimide, and thiopyrane sulfone derivatives.

Examples of the light emitting material include metal complex compounds such as Alq3 and tris(5-cyano-8-hydroxyquinoline)aluminum (Al(Q-CN)), and dyes such as oxathiazoles, e.g., biphenyl-p-(t-butyl)phenyl-1,3,4-oxathiazole, triazoles, allylenes, and coumarins though is not limited thereto.

In the electroluminescent device of the invention, an auxiliary carrier transporting layer is interposed between the anode and the organic layer, and when the organic layer includes a plurality of layers, between the anode and a layer disposed most closely thereto, typically a hole transporting layer, for assisting in charge transportation.

The auxiliary carrier transporting layer is primarily composed of an aromatic amine derivative comprising recurring units of the following general formula (1).

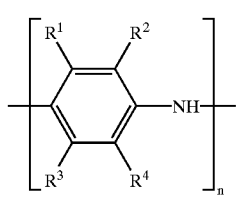

(1)

Advantageously, the aromatic amine derivative is used as a thin film of a soluble, electrically conductive compound in which the aromatic amine derivative forms a salt with an electron accepting dopant.

In formula (1), $R^1$ to $R^4$ each are independently hydrogen, a hydroxyl group, substituted or unsubstituted monovalent hydrocarbon group, organooxy group, acyl group or sulfonate group. $R^1$ to $R^4$ may be the same or different, but $R^1$ to $R^4$ are not hydrogen atoms at the same time.

The substituted or unsubstituted monovalent hydrocarbon groups and organooxy groups represented by $R^1$ are preferably of 1 to 20 carbon atoms. Examples of the monovalent hydrocarbon groups include alkyl groups such as methyl, ethyl, propyl, butyl, tert-butyl, hexyl, octyl and decyl; cycloalkyl groups such as cyclopentyl and cyclohexyl; bicycloalkyl groups such as bicyclohexyl; alkenyl groups such as vinyl, 1-propenyl, 2-propenyl, isopropenyl, 1-methyl-2-propenyl, 1-, 2- or 3-butenyl, and hexenyl; aryl groups such as phenyl, xylyl, tolyl, biphenyl and naphthyl; aralkyl groups such as benzyl, phenylethyl and phenylcyclohexyl; and substituted ones in which some or all of the hydrogen atoms on the foregoing monovalent hydrocarbon groups are substituted with halogen atoms, hydroxyl groups or alkoxy groups. Examples of the organooxy groups include alkoxy, alkenyloxy, and aryloxy groups, whose alkyl, alkenyl and aryl moieties are as exemplified above.

The acyl groups include those of 2 to 10 carbon atoms, for example, acetyl, propionyl, butyryl, isobutyryl and benzoyl.

In the above formula, $R^1$ to $R^4$ are independently selected from among hydrogen atoms, alkyl groups of 1 to 20 carbon atoms, alkoxy groups of 1 to 20 carbon atoms, alkoxyalkyl groups in which the alkoxy moiety has 1 to 20 carbon atoms and the alkyl moiety has 1 to 20 carbon atoms, alkenyl groups of 2 to 4 carbon atoms, acyl groups of 2 to 4 carbon atoms, benzoyl, sulfonate, and hydroxyl, as well as phenyl, cyclohexyl, cyclopentyl, biphenyl, bicyclohexyl and phenylcyclohexyl groups which may have substituents (which are alkyl groups of 1 to 4 carbon atoms or alkoxy groups of 1 to 4 carbon atoms).

Even more preferably, $R^1$ to $R^4$ are independently selected from among hydrogen atoms, alkyl groups of 1 to 4 carbon atoms, alkoxy groups of 1 to 4 carbon atoms, alkoxyalkyl groups in which the alkoxy moiety has 1 to 4 carbon atoms and the alkyl moiety has 1 to 4 carbon atoms, vinyl, 2-propenyl, acetyl, benzoyl, sulfonate and hydroxyl, as well as phenyl, cyclohexyl, biphenyl, bicyclohexyl and phenylcyclohexyl groups which may have substituents (which are alkyl groups of 1 to 4 carbon atoms or alkoxy groups of 1 to 4 carbon atoms).

Illustratively, the alkyl groups of 1 to 4 carbon atoms are methyl, ethyl, propyl, isopropyl, butyl, s-butyl and t-butyl, and the alkoxy groups of 1 to 4 carbon atoms are methoxy, ethoxy, propoxy, isopropoxy, butoxy, s-butoxy and t-butoxy.

In formula (1), n is a positive number of 2 to 3,000 and preferably 4 to 3,000. The aromatic amine derivative of formula (1) has a number average molecular weight of 200 to 100,000 and preferably 400 to 70,000.

The methods of synthesizing the aromatic amine derivatives of formula (1) and soluble conductive compounds therefrom are not critical although they can be synthesized, for example, by the following methods.

Specifically, an aniline derivative, which is a fully purified starting reactant from which antioxidant and other impurities have been removed as by distillation, is combined with an acid in a 1 to 3-fold amount to form a salt.

The resulting salt, which is soluble in water, is dissolved in water in a 2 to 10-fold amount based on the starting reactant. The solution is kept at 25° C., to which ammonium persulfate, cerium sulfate, iron chloride or copper chloride is added as an oxidizing agent. The amount of the oxidizing agent added is 0.5 to 4 moles, preferably 1 to 2 moles per mole of the starting reactant. After the addition of oxidizing agent, reaction is effected for 10 to 50 hours. The reaction solution was filtered, the residue was fully washed with a low-boiling, water-soluble organic solvent such as acetone, methanol, ethanol or isopropanol, yielding a soluble conductive compound. The acid used herein becomes an electron accepting dopant for the aromatic amine derivative and is not critical. The electron accepting dopant is selected from among Lewis acids, protonic acids, transition metal compounds, electrolyte salts and halides.

Lewis acids include $FeCl_3$, $PF_5$, $AsF_5$, $SbF_5$, $BF_5$, $BCl_3$, and $BBr_3$.

Protonic acids include inorganic acids such as HF, HCl, $HNO_5$, $H_2SO_4$ and $HClO_4$, and organic acids such as benzene sulfonic acid, p-toluenesulfonic acid, dodecylbenzenesulfonic acid, polyvinylsulfonic acid, methanesulfonic acid, 1-butanesulfonic acid, vinylphenylsulfonic acid and camphorsulfonic acid.

Transition metal compounds include FeOCl, $TiCl_4$, $ZrCl_4$, $HfCl_4$, $NbF_5$, $NbCl_5$, $TaCl_5$ and $MoF_5$.

Electrolyte salts include $LiSbF_6$, $LiAsF_6$, $NaAsF_6$, $NaSbF_6$, $KAsF_6$, $KSbF_6$, $[(n-Bu)_4N]AsF_6$, $[(n-Bu)_4N]SbF_6$, $[(n-Et)_4N]AsF_6$ and $[(n-Et)_4N]SbF_6$.

Halides includes $Cl_2$, $Br_2$, $I_2$, ICl, $ICl_3$, IBr and IF.

Of these electron accepting dopants, ferric chloride is the preferred Lewis-acid, hydrochloric acid is the preferred protonic acid, perchloric acid is the preferred inorganic acid, and p-toluenesulfonic acid and camphorsulfonic acid are the preferred organic acids.

In the case of aromatic amine derivatives having no dopant, the soluble conductive compound obtained by the above method is washed with an alkali, obtaining the desired aromatic amine derivative. The alkali used herein is not critical although it is desirably ammonia or sodium hydrogen carbonate. Thus, the aromatic amine derivative of the invention is readily obtained through alkali treatment of the soluble conductive compound.

The aromatic amine derivative of the invention thus obtained can be readily converted into a soluble conductive compound or conductive high-molecular-weight compound by doping it with the above-described electron accepting dopant such as a Lewis acid, protonic acid, transition metal compound or electrolyte salt.

The dopant-forming electron acceptor is generally added in such an amount as to give one or less dopant per nitrogen atom in the recurring units of conjugated structure containing nitrogen as a basic atom.

Alternatively, doping can be carried out by forming a coating of the aromatic amine derivative of the invention and then exposing the coating to hydrochloric acid vapor or iodine vapor.

The soluble conductive compounds of the invention thus obtained are soluble in common organic solvents, for example, chlorinated solvents such as chloroform, dichloroethane, and chlorobenzene, amide solvents such as N,N-dimethylformamide and N,N-dimethylacetamide and polar solvents such as phenolic solvents in a proportion of 2 to 10% by weight. Of these, N,N-dimethylformamide is most desirable in order to obtain a fully stable varnish which does not gel. In this case, the solubility is usually 5 to 7% by weight.

It is noted that even a solvent which does not form a uniform medium when used alone can be used in combination with another solvent insofar as a uniform medium is obtainable. Such examples include ethyl cellosolve, butyl cellosolve, ethyl Carbitol, butyl Carbitol, ethyl Carbitol acetate and ethylene glycol.

When a coating of the soluble conductive compound is formed on a substrate, it is, of course, preferable to add additives such as coupling agents to a solution of the soluble conductive compound for the purpose of further improving the adhesion of the soluble conductive compound coating to the substrate.

The coating method of forming a thin film of the soluble conductive compound includes dipping, spin coating, transfer printing, roll coating and brush coating, but is not limited thereto. The coating thickness is not critical although a coating as thin as possible is desirable for improving external emission efficiency. Usually, a thickness of 100 to 1,000 Å is preferred.

By applying the solution onto a substrate and evaporating off the solvent, a coating of the aromatic amine derivative or conductive compound thereof according to the invention can be formed on the substrate. The temperature used in this step is sufficient for the solvent to evaporate and generally in the range of 80 to 150° C.

The electroluminescent device in the invention is fabricated by any desired method. Typically, a thin film of the aromatic amine derivative or conductive compound thereof is first formed on ITO serving as an inorganic electrode. The ITO electrode used herein has been removed of foreign matter such as organic matter on the surface by cleaning treatment such as back sputtering or ozone treatment. The method of forming a thin film of the aromatic amine derivative or conductive compound thereof is not critical although spin coating or evaporation is preferably used. More preferably, spin coating is used.

On the electrode-bearing substrate thus obtained, electroluminescent organic materials are deposited. Their laminate structure largely varies and is not critical. Most often, a device in which a hole transporting layer, a light emitting layer and a carrier transporting layer are sequentially deposited by evaporation is used. These materials are sequentially deposited by vacuum evaporation and on the top of them, a MgAg alloy, for example, is evaporated as a cathode. This results in an electroluminescent device which emits light of a specific wavelength upon application of an electric field.

Examples and comparative examples are given below for illustrating the present invention although the invention is not limited to the examples.

EXAMPLE 1

To 0.2 mol (27.4 g) of o-phenetidine, 30.86 g (0.3 mol) of 35% hydrochloric acid was added, and 200 ml of water poured, followed by stirring at the boiling point for 2 hours. Thereafter, the solution was cooled to 5° C., to which a solution of 0.2 mol ammonium persulfate in 100 ml water was added dropwise at a reaction temperature of 0 to 5° C. After the completion of dropwise addition, stirring was continued for a further 24 hours at a reaction temperature of 0 to 5° C. At the end of reaction, the product was poured into a large volume of acetone, washed and filtered. This operation was repeated until the filtrate became colorless.

By GPC and IR, the polymer thus obtained was identified to be the end compound.

IR: 3350 $cm^{-1}$ (vNH), 1320 $cm^{-1}$ (vCN), 1220 $cm^{-1}$ (vCO), 820 $cm^{-1}$ (1,4-substituted benzene); GPC: number average molecular weight 2,700 polydispersity index (Mw/Mn) 8.35 (measurement conditions: eluent DMF, flow rate 1.0 ml/min, polystyrene basis, column KD805 by Showa Denko Co., Ltd.).

The resulting polymer, 2 g, was dissolved in 98 g of N,N-dimethylformamide solvent, to which 0.015 mol (3.44 g) of camphorsulfonic acid was added as a dopant, followed by stirring for one day at room temperature. The varnish thus obtained was passed through a 0.2-micron filter to remove the insoluble.

An electroluminescent device was fabricated as follows under such conditions that a thin film was formed from the varnish to a thickness of 100 Å by a spin coating technique.

ITO-deposited glass was available from Sanyo Electric Co., Ltd. and had an ITO thickness of 1000 Å. This substrate was subjected to ultrasonic cleaning with acetone and isopropyl alcohol and then to ozone treatment. To the thus treated substrate, the varnish was spin coated to form a thin film of 100 Å thick. On the substrate, TPD, Alq, and MgAg were formed by vacuum evaporation to a thickness of 400 Å, 600 Å, and 2000 Å, respectively.

Figure 2:
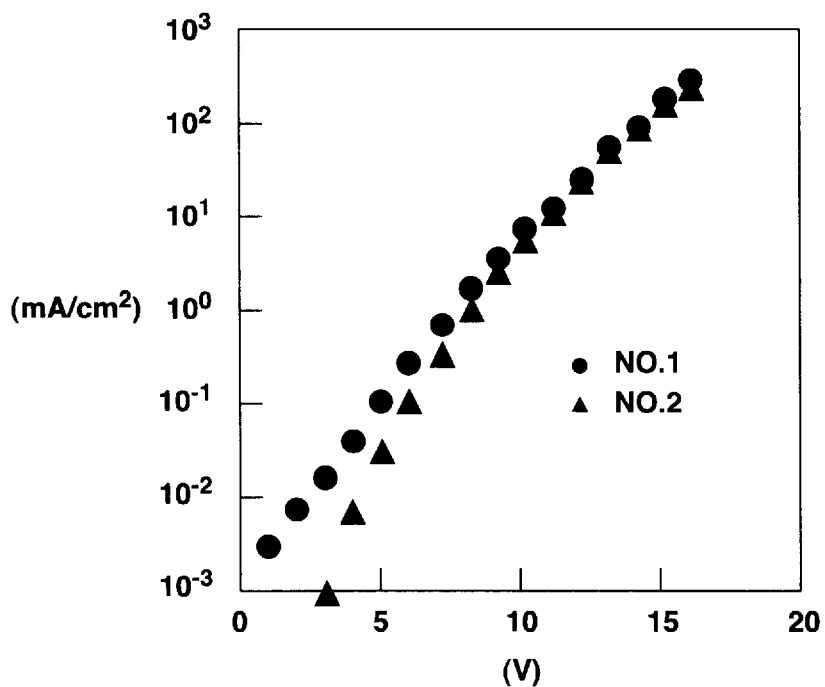
FIG. 2 is a graph showing the dependence of current density on voltage of the electroluminescent device fabricated in Example 1 and 2.

The thus fabricated device was measured for light emission performance by applying a voltage. FIG. 1 illustrates the dependence of emission luminance on voltage, and FIG. 2 illustrates the voltage versus current density.

EXAMPLE 2

To 0.2 mol (27.4 g) of o-phenetidine, 30.86 g (0.3 mol) of 35% hydrochloric acid was added, and 200 ml of water poured, followed by stirring at the boiling point for 2 hours. Thereafter, the solution was cooled to 5° C., to which a solution of 0.2 mol ammonium persulfate in 100 ml water was added dropwise at a reaction temperature of 0 to 5° C. After the completion of dropwise addition, stirring was continued for a further 24 hours at a reaction temperature of 0 to 5° C. At the end of reaction, the product was poured into a large volume of acetone, washed and filtered. This operation was repeated until the filtrate became colorless.

By GPC and IR, the polymer thus obtained was identified to be the end compound.

IR: 3350 cm$^{-1}$ (vNH), 1320 cm$^{-1}$ (vCN), 1220 cm$^{-1}$ (vCO), 820 cm$^{-1}$ (1,4-substituted benzene); GPC: number average molecular weight 2,700 polydispersity index (Mw/Mn) 8.35 (measurement conditions: eluent DMF, flow rate 1.0 ml/min, polystyrene basis, column KD805 by Showa Denko Co., Ltd.).

The resulting polymer, 2 g, was dissolved in 98 g of N,N-dimethylformamide solvent, to which 0.03 mol (6.88 g) of camphorsulfonic acid was added as a dopant, followed by stirring for one day at room temperature. The varnish thus obtained was passed through a 0.2-micron filter to remove the insoluble.

Using the varnish, an electroluminescent device was fabricated as in Example 1.

Specifically, ITO-deposited glass was available from Sanyo Electric Co., Ltd. and had an ITO thickness of 1000 Å. This substrate was subjected to ultrasonic cleaning with acetone and isopropyl alcohol and then to ozone treatment. To the thus treated substrate, the varnish was spin coated to form a thin film of 100 Å thick. On the substrate, TPD, Alq, and MgAg were formed by vacuum evaporation to a thickness of 400 Å, 600 Å, and 2000 Å, respectively.

Figure 3:
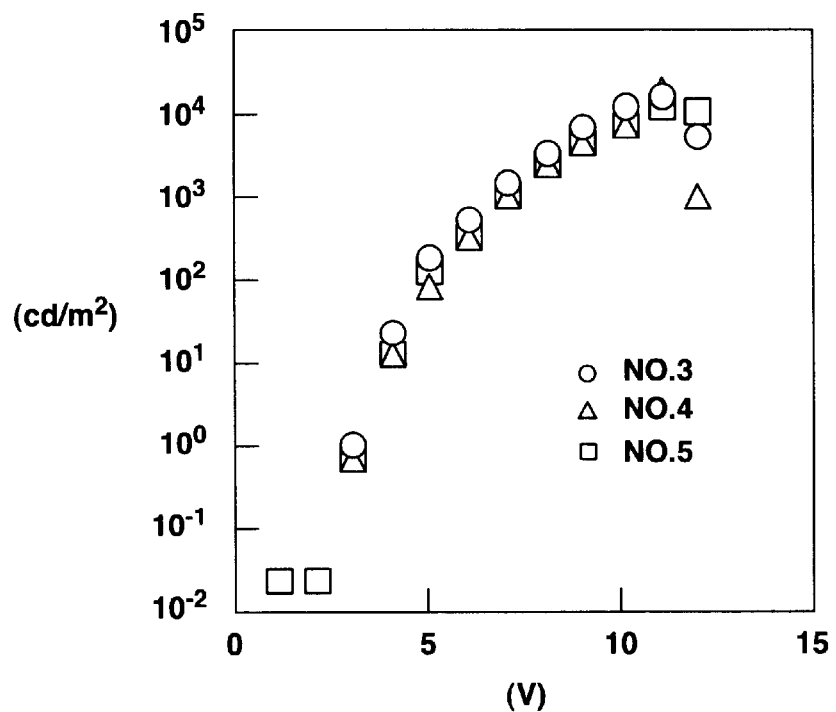
FIG. 3 is a graph showing the dependence of emission luminance on voltage of the electroluminescent devices fabricated in Example 3.
Figure 4:
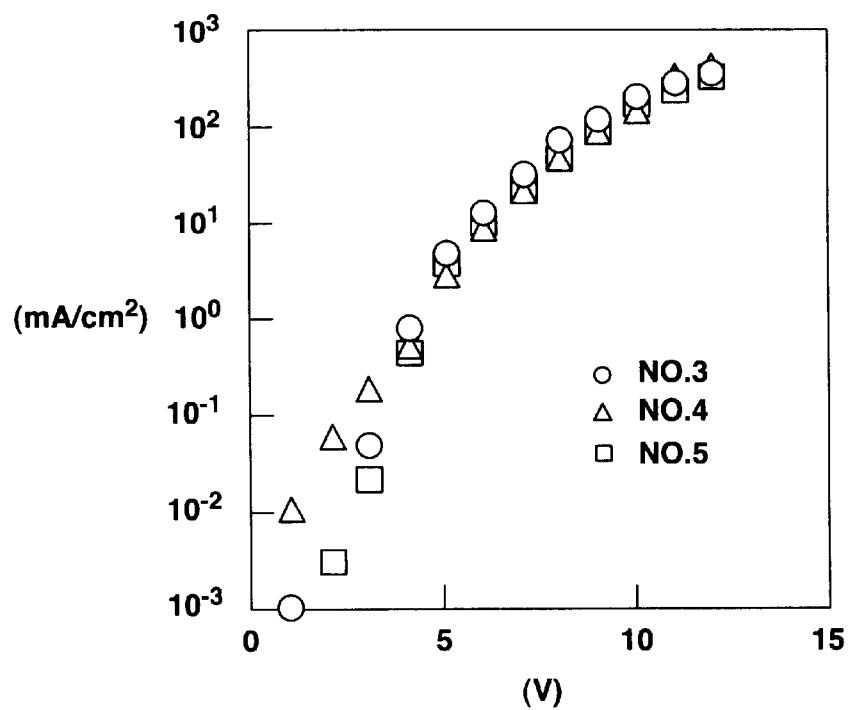
FIG. 4 is a graph showing the dependence of current density on voltage of the electroluminescent devices fabricated in Example 3.

The thus fabricated device was measured for light emission performance by applying a voltage. FIG. 3 illustrates the dependence of emission luminance on voltage, and FIG. 4 illustrates the voltage versus current density.

EXAMPLE 3

To 0.2 mol (27.4 g) of o-phenetidine, 30.86 g (0.3 mol) of 35% hydrochloric acid was added, and 200 ml of water poured, followed by stirring at the boiling point for 2 hours. Thereafter, the solution was cooled to 5° C., to which a solution of 0.2 mol ammonium persulfate in 100 ml water was added dropwise at a reaction temperature of 0 to 5° C. After the completion of dropwise addition, stirring was continued for a further 24 hours at a reaction temperature of 0 to 5° C. At the end of reaction, the product was poured into a large volume of acetone, washed and filtered. This operation was repeated until the filtrate became colorless.

By GPC and IR, the polymer thus obtained was identified to be the end compound.

IR: 3350 cm$^{-1}$ (vNH), 1320 cm$^{-1}$ (vCN), 1220 cm$^{-1}$ (vCO), 820 cm$^{-1}$ (1,4-substituted benzene); GPC: number average molecular weight 2,700 polydispersity index (Mw/Mn) 8.35 (measurement conditions: eluent DMF, flow rate 1.0 ml/min, polystyrene basis, column KD805 by Showa Denko Co., Ltd.).

The resulting polymer, 2 g, was dissolved in 98 g of N,N-dimethylformamide solvent, to which 0.015 mol (3.27 g) of 5-sulfosalicylic acid was added as a dopant, followed by stirring for one day at room temperature. The varnish thus obtained was passed through a 0.2-micron filter to remove the insoluble. At the same time, varnishes were prepared by adding 0.03 mol of 5-sulfosalicylic acid and 0.045 mol of 5-sulfosalicylic acid, and similarly evaluated.

Using the varnish, a thin film was formed by a spin coating technique.

Specifically, ITO-deposited glass was available from Sanyo Electric Co., Ltd. and had an ITO thickness of 1000 Å. This substrate was subjected to ultrasonic cleaning with acetone and isopropyl alcohol and then to ozone treatment. To the thus treated substrate, the varnish was spin coated to form a thin film of 100 Å thick. On the substrate, TPD, Alq, and MgAg were formed by vacuum evaporation to a thickness of 400 Å, 600 Å, and 2000 Å, respectively.

The thus fabricated device was measured for light emission performance by applying a voltage. FIG. 3 illustrates the dependence of emission luminance on voltage, and FIG. 4 illustrates the voltage versus current density.

COMPARATIVE EXAMPLE 1

Figure 5:
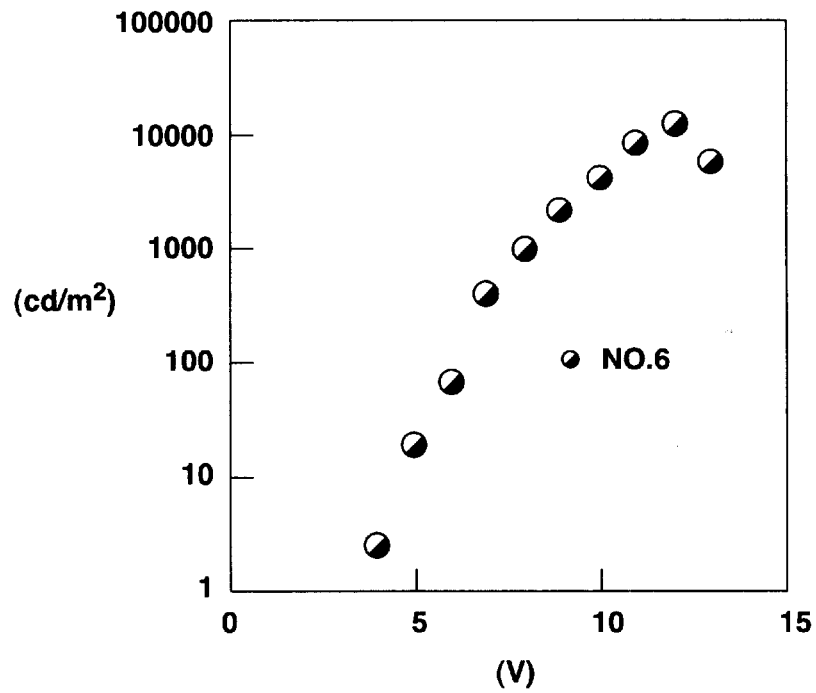
FIG. 5 is a graph showing the dependence of emission luminance on voltage of the electroluminescent device fabricated in Comparative Example 1.
Figure 6:
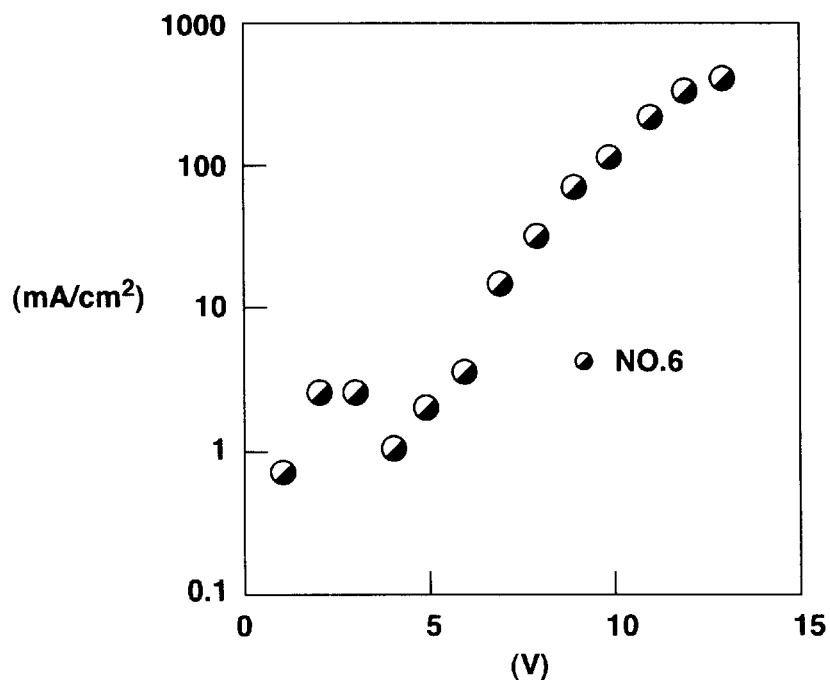
FIG. 6 is a graph showing the dependence of current density on voltage of the electroluminescent device fabricated in Comparative Example 1.

For comparison purposes, device structures of ITO/TPD/Alq/MgAg were measured for emission performance. The respective layers other than ITO were formed by vacuum evaporation. FIG. 5 illustrates the dependence of emission luminance on voltage, and FIG. 6 illustrates the voltage versus current density.

In FIGS. 1 to 6, Nos. 1 to 5 represent the results of electroluminescent devices of cathode/auxiliary carrier transporting layer/hole transporting layer/light emitting material layer/anode construction, and No. 6 represents the results of an electroluminescent device of cathode/hole transporting layer/light emitting material layer/anode construction. The respective layers were composed of the following components.

Cathode: indium tin oxide

Auxiliary carrier transporting layer: the above-prepared poly(o-phenetidine)
  No. 1: o-phenetidine/camphorsulfonic acid=1/1
  No. 2: o-phenetidine/camphorsulfonic acid=1/2
  No. 3: o-phenetidine/5-sulfosalicylic acid=1/1
  No. 4: o-phenetidine/5-sulfosalicylic acid=1/2
  No. 5: o-phenetidine/5-sulfosalicylic acid=1/3 Hole transporting layer:
    N,N'-diphenyl-N,N'-bis(3-methylphenyl)(1,1'-bisphenyl)-4,4'-diamine Light emitting material layer:
 aluminum 8-hydroquinoline complex
Anode:
 magnesium-silver alloy

COMPARATIVE EXAMPLE 2

To 0.2 mol (18.6 g) of aniline was added 30.86 g (0.3 mol) of 35% hydrochloric acid. Then 200 ml of water was poured to the solution, which was stirred at the boiling point for 2 hours. Thereafter, the solution was cooled to 5° C., to which a solution of 0.2 mol ammonium persulfate in 100 ml water was added dropwise at a reaction temperature of 0 to 5° C. After the completion of dropwise addition, stirring was continued for a further 24 hours at a reaction temperature of 0 to 5° C. At the end of reaction, the product was poured into a large volume of acetone, washed and filtered. This operation was repeated until the filtrate became colorless.

By GPC and IR, the polymer thus obtained was identified to be the end compound.

The resulting polymer, 2 g, was dissolved in 98 g of N,N-dimethylformamide solvent, to which 0.015 mol (3.27 g) of 5-sulfosalicylic acid was added as a dopant, followed by stirring for one day at room temperature. An attempt was made to pass the varnish thus obtained through a 0.2-micron filter to remove the insoluble, but failed. A thin film was formed using the non-filtered varnish, finding asperities in excess of 2000 Å.

Using the varnish, an electroluminescent device was fabricated. Electrical shorts due to asperities in excess of 2000 Å prevented evaluation of its performance.

As is evident from the above examples, the electroluminescent device of the invention has a low drive voltage.

What is claimed is:

1. An electroluminescent device comprising an anode, a cathode, and at least one electroluminescent organic layer interposed therebetween, wherein a luminescent material in said organic layer emits light upon application of a voltage between the anode and the cathode, and wherein an auxiliary carrier transporting layer which contains an aromatic amine derivative comprising recurring units of the following general formula (1) and having a number average molecular weight of 250 to 100,000 is formed between said anode and said organic layer,

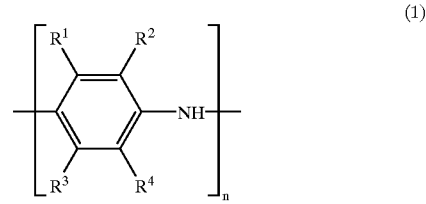

(1)

wherein $R^1$ to $R^4$ each are independently hydrogen, a hydroxyl group, substituted or unsubstituted monovalent hydrocarbon group, organooxy group, acyl group or sulfonate group, excluding the case where all $R^1$ to $R^4$ are hydrogen atoms at the same time, and n is a positive number of 2 to 3,000.

2. The electroluminescent device of claim 1 wherein said auxiliary carrier transporting layer is formed of a soluble, electrically conductive compound in which said aromatic amine derivative forms a salt with an electron accepting dopant.

3. The electroluminescent device of claim 2 wherein the electron accepting dopant is selected from the group consisting of a Lewis acid, protonic acid, transition metal compound, electrolyte salt and halide.

* * * * *